(12) United States Patent
Fehlhaber et al.

(10) Patent No.: US 8,278,707 B2
(45) Date of Patent: Oct. 2, 2012

(54) FIELD EFFECT TRANSISTORS HAVING A DOUBLE GATE STRUCTURE

(75) Inventors: Rodger Fehlhaber, Munich (DE); Helmut Tews, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/830,048

(22) Filed: Jul. 2, 2010

(65) Prior Publication Data

US 2010/0264472 A1  Oct. 21, 2010

Related U.S. Application Data

(62) Division of application No. 10/575,916, filed as application No. PCT/EP2004/052333 on Sep. 28, 2004, now Pat. No. 7,767,100.

(30) Foreign Application Priority Data

Oct. 15, 2003  (DE) .................................. 103 48 007

(51) Int. Cl.
*H01L 29/66* (2006.01)
(52) U.S. Cl. ................. 257/331; 257/E29.234
(58) Field of Classification Search .................. 257/331, 257/E29.264, E29.234
See application file for complete search history.

(56) References Cited

U.S. PATENT DOCUMENTS

| 5,899,746 | A | 5/1999 | Mukai | 438/700 |
|---|---|---|---|---|
| 5,918,132 | A | 6/1999 | Qian et al. | 438/299 |
| 6,403,456 | B1 | 6/2002 | Plat et al. | 438/579 |
| 6,413,802 | B1 * | 7/2002 | Hu et al. | 438/151 |
| 6,562,665 | B1 | 5/2003 | Yu | 438/149 |
| 6,605,541 | B1 | 8/2003 | Yu | 438/700 |
| 6,642,090 | B1 * | 11/2003 | Fried et al. | 438/164 |
| 6,762,483 | B1 | 7/2004 | Krivokapic et al. | 257/618 |
| 2002/0011612 | A1 | 1/2002 | Hieda | 257/262 |
| 2003/0085424 | A1 | 5/2003 | Bryant et al. | 257/347 |
| 2003/0141546 | A1 | 7/2003 | Maegawa | 257/347 |
| 2003/0141569 | A1 | 7/2003 | Fried et al. | 257/536 |
| 2004/0198003 | A1 * | 10/2004 | Yeo et al. | 438/284 |
| 2005/0121412 | A1 | 6/2005 | Beintner et al. | 216/11 |

FOREIGN PATENT DOCUMENTS

| DE | 39 15 650 A1 | 11/1990 |
|---|---|---|
| DE | 195 36 523 A1 | 4/1997 |

* cited by examiner

*Primary Examiner* — Matthew Landau
*Assistant Examiner* — Daniel Luke

(57) ABSTRACT

A field effect transistor includes two channel connection regions, a control region with at least two control sections, an active region that is formed as a projection of a mono crystalline substrate disposed between the channel connection regions and between two control region sections, and insulating regions that are electrically insulating and are disposed between the control region sections and the active region. The projection is isolated from the substrate at a base by an insulating material that is electrically insulating. The insulating material ends laterally at the projection in the mono crystalline substrate.

13 Claims, 3 Drawing Sheets

# FIELD EFFECT TRANSISTORS HAVING A DOUBLE GATE STRUCTURE

RELATED APPLICATIONS

This application is a Divisional of U.S. application Ser. No. 10/575,916, filed Dec. 22, 2006, which is a National Stage Entry of PCT/EP04/52333, filed Sep. 28, 2004, which claims priority to German patent application No. 103 48 007.2, filed Oct. 15, 2003.

BACKGROUND

The invention relates to a patterning method. In particular, this invention relates to a patterning method and field effect transistors.

BRIEF SUMMARY

The method is intended to enable the smallest possible minimum feature sizes to be produced, that is to say feature sizes of less than one hundred nanometers or even less than fifty nanometers.

In order to produce feature sizes that are less than half a wavelength of electromagnetic waves used in a lithography method, the following methods can be used inter alia:
  spacer technique, in which a layer is deposited on a step and is subsequently etched isotropically,
  so-called phase shift masks, which exploit interference effects, and
  so-called trimming, in which a structure is etched isotropically in order to reduce its dimensions.

It is an object of the invention to specify a simple patterning method which makes it possible to produce in particular minimum dimensions of less than half a photolithographic wavelength, in particular of less than one hundred nanometers or less than fifty nanometers. Moreover, the method is intended to afford the possibility, in particular, of also increasing the mechanical loadability of structures having a minimum feature size. Moreover, the intention is to specify field effect transistors, in particular a double-fin field effect transistor.

The object referring to the method is achieved by means of a method having the features specified in patent claim 1. Developments are specified in the subclaims.

The invention is based on the consideration that all the known methods are associated with disadvantages. Thus, the spacer technique leads to rounded spacers which adversely affect the dimensional accuracy of a structure etched with the spacers. Phase shift masks are very expensive in comparison with photomasks that do not exploit interference effects. Trimming leads to comparatively rough structures that are not dimensionally accurate on account of inhomogeneous etching conditions.

In the case of the method according to the invention, the following method steps are performed without restriction by the order specified:
  application of an auxiliary layer to a carrier material, the auxiliary layer being either an inorganic layer or an organic layer, in particular a resist layer,
  patterning of the auxiliary layer and of the carrier material with production of a cutout,
  expansion of the cutout in the region of the auxiliary layer, the cutout, in the region of the carrier material, not being expanded or not being expanded to as great an extent as in the region of the auxiliary layer,
  filling of the expanded cutout with a filling material,
  preferably complete removal of the auxiliary layer after filling,
  patterning of the carrier material using the filling material and with production of at least one further cutout, the filling material being an inorganic material or an organic material, e.g. a resist.

A further patterning method is thus specified which permits very small and very dimensionally accurate structures to be produced in a simple fashion. In one refinement, the expansion of the cutout is carried out by means of an etching-back step, which is also referred to as a pull-back step. The expansion gives rise to a cutout having a T-shaped cross section. Consequently, the filling material introduced into the cutout also has a T-shaped cross section, that is to say a cross section which expands symmetrically toward one end.

The expansion can also be delimited to a part of the edge of the cutout by means of an additional masking step, in particular by means of an additional photolithographic method, so that therefore, in particular, only one structure is produced per cutout. It is often not a cause of disturbance, however, if two or more than two structures arise per cutout, so that an additional masking step is not required. In particular, the additional masking step can be avoided by a suitable choice of the dimensions of the cutout.

In one development, the auxiliary layer and the carrier material are patterned in order to produce the cutout by means of a photolithographic method. The photolithography limits the smallest lateral dimension of the cutout and hence the dimensions between the structures to be produced. This is acceptable, however, since in many cases the distances between structures are considerably greater than the minimum feature size of the structures themselves. If the auxiliary layer is a resist layer, then intermediate layers are used in order to remove firstly only the upper resist layer but not the auxiliary layer.

In another development, the filling material is planarized prior to the repeated patterning, e.g. by means of a CMP method, in order to obtain a dimensionally accurate filling structure and hence a dimensionally accurate subsequent patterning. Instead of planarization, however, it is also possible to use other methods, e.g. selective filling with selective oxidation.

In another development of the method according to the invention, the carrier material contains a hard mask layer, which is patterned with the aid of the filling material. The mask layer then serves e.g. for its part for the patterning of a substrate, e.g. for the production of a semiconductor circuit, in particular for the production of gate electrodes, e.g. made from polycrystalline silicon, made from metal or made from a layer sequence of metal and polycrystalline silicon. However, the hard mask layer is also used for the production of a so-called stencil mask, that is to say a mask which is used subsequently to carry out a photolithographic method, e.g. electron projection lithography, with an imaging scale of 1:1. Hard mask layers are more resistant to etching attacks in comparison with a resist.

Situated between the mask layer and the auxiliary layer is e.g. only an intermediate layer which is thin in comparison with the mask layer or the auxiliary layer and the thickness of which is e.g. less than one third of the thinner of the two layers. The intermediate layer serves e.g. for better mechanical adhesion or for taking up mechanical stresses.

In an alternative development, the carrier material contains a semiconductor material, in particular a monocrystalline semiconductor material, from which a semiconductor circuit or a mask is fabricated. The cutout then e.g. already defines one side area of a fin for a finFET.

In a next development, at least one layer is deposited or grown in the expanded cutout prior to filling, in particular an electrically insulating layer for producing a gate dielectric and an electrically conductive layer for producing a gate electrode of a field effect transistor. The layer that is introduced into the cutout can, for its part, be patterned by the method according to the invention, so that short gate lengths are produced in a simple manner.

In a next development, a further cutout situated alongside the cutout filled with the filling material is filled with a further filling material before the filling material used for patterning is removed. The filling material serving for patterning is not removed until after the further cutout has been filled, so that even thin structures between the two cutouts are laterally supported at any time. Therefore, the structures can neither tip over nor incline laterally.

In an alternative development, the filling material is only partially removed from the cutout, one part of the bottom of the cutout being uncovered and another part of the bottom of the cutout remaining covered with filling material. The remainder of the filling material serves as a mechanical support and is not removed until after further method steps have been carried out, e.g. after the deposition of at least one further layer or after carrying out an oxidation. As an alternative, the remainder of the filling material remains in an integrated circuit arrangement.

In another development, a semiconductor material is oxidized in the region between the cutout and the further cutout in order to improve the electrical properties of a transistor, in particular in order to avoid parasitic capacitances under drain and/or source contact pads. The oxidation is preferably carried out prior to the removal of the filling material from the cutout or prior to the complete removal of the filling material from the cutout and preferably after the production of an oxidation protective layer on at least one side wall of the further cutout. The filling material thus supports the structures under which the oxide grows. In the case of complete insulation of the fin by the oxide produced during the underoxidation, an SOI structure arises which is simple to produce and leads to components having outstanding electrical properties.

Small minimum feature sizes are required in particular in the case of field effect transistors. Therefore, the invention relates in further aspects to field effect transistors such as can be produced in particular by the method according to the invention or one of its developments, so that the technical effects explained above are applicable in this case. In comparison with a single-fin field effect transistor, a double-fin field effect transistor according to the invention is distinguished by improved and new electrical properties that open up new application possibilities. Field effect transistors having more than two fins per transistor, e.g. having three, four or five fins, are also produced.

In another field effect transistor according to the invention, the fin is e.g. thermally underoxidized and preferably completely electrically insulated from the silicon wafer. Such transistors can be produced in a simple manner if, with regard to the mechanical stability, the fin is always supported on a wall, e.g. by the filling material or by a further filling material which is applied after patterning with the aid of the filling material contained in the cutout.

In one development of the field effect transistor, a projection for the active region of the transistor has sidewalls of different lengths, the difference being greater than one nanometer, greater than three nanometers or greater than five nanometers. This affords the possibilities of implementing the etching stop during the first patterning and during the second patterning with greater tolerances. Moreover, an underoxidation of the projections is facilitated.

BRIEF DESCRIPTION OF THE SEVERAL VIEWS OF THE DRAWINGS

Exemplary embodiments of the invention are explained below with reference to the accompanying drawings, in which.

DETAILED DESCRIPTION

Figure 1A:
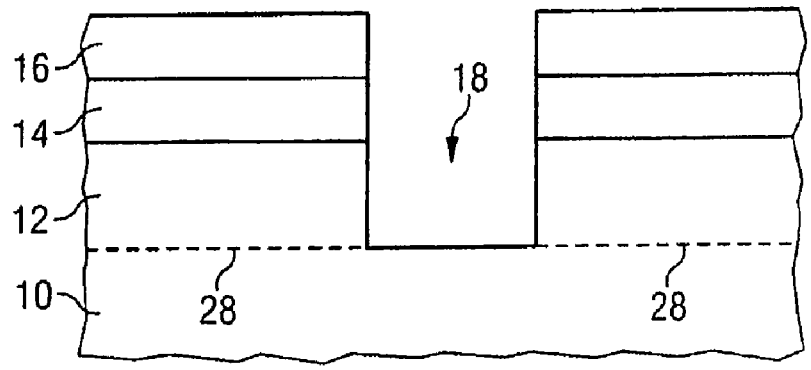
FIGS. 1A to 1D show production stages of an exemplary embodiment for the production of a hard mask or for the direct patterning of a semiconductor substrate.

FIGS. 1A to 1D show production stages of an exemplary embodiment for the production of a hard mask or for the direct patterning of a semiconductor substrate. The production of the hard mask is explained first.

A hard mask layer 12 is applied on a semiconductor substrate 10, e.g. on a silicon wafer, the thickness of which hard mask layer depends e.g. on the height of a structure that is to be produced later using the completed hard mask. By way of example, the thickness of the hard mask layer 12 matches the height of a gate or the height of a fin for a finFET. In the exemplary embodiment, the thickness of the hard mask layer 12 is e.g. 40 nanometers.

An auxiliary layer 14 is then applied to the hard mask layer 12, said auxiliary layer comprising a different material than the hard mask layer 12. By way of example, the hard mask layer 12 comprises TEOS (tetraethyl orthosilicate) and the auxiliary layer 14 comprises silicon nitride or some other nitride. In an alternative exemplary embodiment, by contrast, the hard mask layer 12 comprises a nitride and the auxiliary layer 14 comprises TEOS. Optionally, a thin intermediate layer or an intermediate layer sequence is applied after the application of the hard mask layer 12. The auxiliary layer 14 is then applied to the intermediate layer or the intermediate layer sequence. In the exemplary embodiment, the auxiliary layer 14 has a thickness in the range of fifty nanometers to one hundred nanometers.

A resist layer 16, e.g. photoresist, is subsequently applied to the auxiliary layer 14, a thin antireflection layer, by way of example, optionally having been applied beforehand. The resist layer 16 is subsequently irradiated, in particular exposed, in accordance with a pattern and developed. The lithography method is noncritical since minimum feature sizes to be produced are greater than one hundred nanometers or at least greater than fifty nanometers. A pattern is e.g. a rectangular area with optional extensions for later source and drain contact pads.

The auxiliary layer 14 is subsequently patterned in accordance with the resist layer 16 by means of an anisotropic etching method, e.g. by means of reactive ion etching (RIE), a cutout 18 being produced. The cutout 18 is subsequently likewise extended right into the hard mask layer 12 by means of an anisotropic etching method, so that the bottom of the cutout reaches as far as the semiconductor substrate 10. The semiconductor substrate 10 serves e.g. as an etching stop. Preferably, the etching conditions remain the same during the etching of the cutout 18 and etching is effected without any interruption. Afterward, in one exemplary embodiment, the residues of the resist layer 16 that have remained on the prepatterned auxiliary layer 14 are removed. In a further exemplary embodiment, the resist structures remain on the auxiliary layer 14. During the etching of the cutout 12, in another exemplary embodiment, the auxiliary layer 14 is also used as a mask if the resist layer 16 has already been removed on account of the depth of the cutout 18.

Figure 1B:
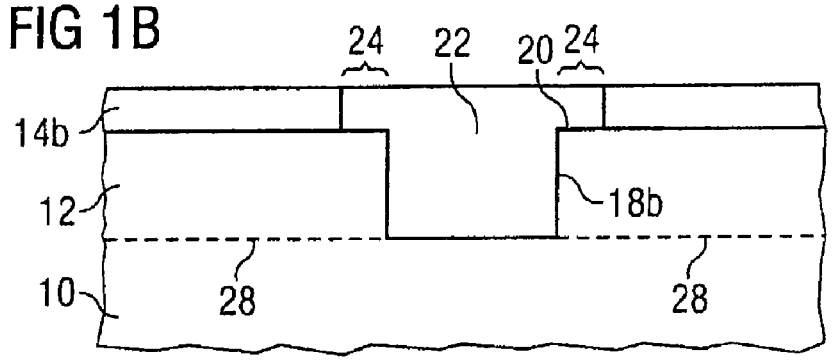
Figure 1C:
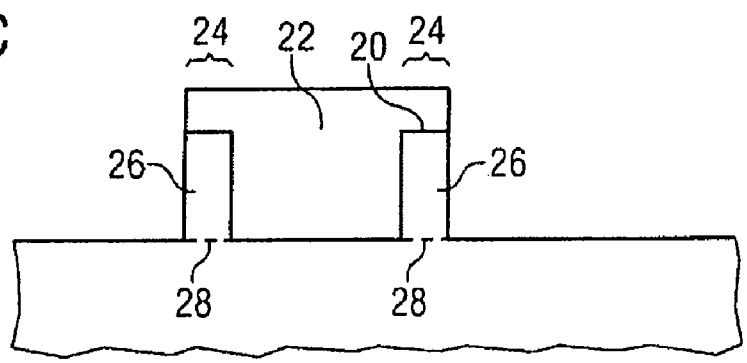

As shown in FIG. 1B, a step of isotropically etching back the auxiliary layer 14 is then carried out, the auxiliary layer 14 being thinned direction-independently and selectively with respect to the hard mask layer 12 to form an auxiliary layer 14b. In this case, the resist layer 16 acts as protection of the auxiliary layer 14 and prevents this layer from being thinned if the resist layer 16 is still present. The resist layer 16 is subsequently removed in this case. The auxiliary layer 14 is always etched back laterally, however. In this case, the cutout 18 is extended in the region of the auxiliary layer 14b to form a cutout 18b. In the region of the hard mask layer 12, by contrast, the dimensions of the cutout 18b are unchanged in comparison with the cutout 18. At the level of the boundary between hard mask layer 12 and patterned auxiliary layer 14b, an area 20 lying approximately parallel to the bottom of the cutout 18 arises in the cutout 18, from which area the auxiliary layer is removed during the etching-back. By way of example, this process effects etching-back by less than fifty nanometers or by less than twenty nanometers, so that the area 20 also has a corresponding minimum dimensioning. The cutout 18b has a T-shaped cross section on account of the expansion. The magnitude of the etching-back thus determines the minimum feature size to be produced.

As is likewise illustrated in FIG. 1B, the extended cutout 18b is subsequently filled with a filling material 22, which differs with regard to its material composition both from the material of the hard mask layer 12 and from the material of the thinned auxiliary layer 14b. By way of example, silicon carbide or polycrystalline silicon is used as the filling material. After the cutout 18b has been filled, a planarization step is carried out, during which the auxiliary layer 14b serves as a stop layer. By way of example, planarization is effected by means of a CMP method (chemical mechanical polishing) or a whole-area etching process.

The residues of the thinned auxiliary layer 14b are then removed selectively with respect to the hard mask layer 12 and selectively with respect to the filling material 22 by means of a wet-chemical or dry-chemical etching method. Projections 24 of the filling material 22 remain above the area 20, which projections cover a part of the hard mask layer 12 in regions at which the hard mask is to be formed.

As is illustrated in FIG. 10, the projections 24 subsequently serve as a mask during the patterning of the hard mask layer 12 e.g. by means of an anisotropic etching method. During the patterning of the hard mask layer 12, the semiconductor substrate 10, by way of example, serves as an etching stop. Hard mask regions 26 arise below the projections 24.

Figure 1D:
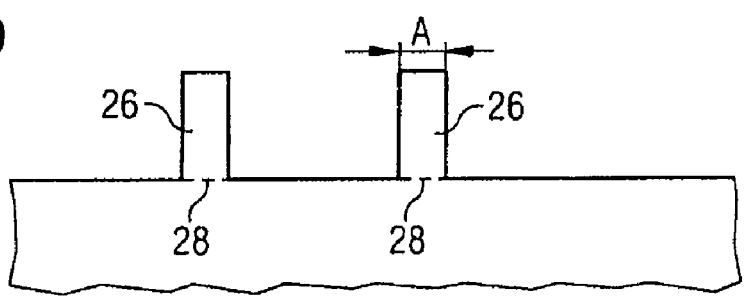

As is shown in FIG. 1D, the filling material 20 is subsequently removed, e.g. by means of a dry-chemical etching process or by means of a wet-chemical etching process. As a result, the hard mask regions 26 stand free and can serve for the patterning of the semiconductor substrate 10. The hard mask regions 26 are situated close to one another and have a minimum dimension A of the fin widths which is sublithographic and, in particular, lies in the range of 5 nanometers to 50 nanometers.

A finFET can then be produced according to a customary method. The next step for producing the finFET consists in producing the fin of the finFET.

If a planar field effect transistor is intended to be produced with the aid of the hard mask regions 26, then instead of the semiconductor substrate 10 use is made of a substrate which contains e.g. a polycrystalline silicon layer and a dielectric as gate stack, which is patterned with the aid of the hard mask regions 26 to form gate electrodes.

An alternative exemplary embodiment involves carrying out a method having the same method steps as explained above with reference to FIGS. 1A to 1D. However, semiconductor substrate is present in place of the hard mask layer 12, see dashed lines 28. However, the cutout 18 is etched in a time-controlled manner. The etching step using the filling material as a mask is also carried out in a time-controlled manner. Sidewalls of the hard mask regions 26 that have different heights can thereby arise, see e.g. FIG. 2D. With regard to greater tolerances during the time-controlled etching, however, height differences of several nanometers are acceptable since e.g. the electrical properties of a FET are impaired only insignificantly on account of the asymmetry that arises.

FIGS. 2A to 2D show production stages of an exemplary embodiment for producing a double-fin field effect transistor with and without underoxidation. An exemplary embodiment without underoxidation is explained first.

An auxiliary layer 14c, for example an oxide layer, in particular a silicon oxide layer, or a nitride layer, in particular a silicon nitride layer, is applied to a semiconductor substrate 10c with or without interim deposition of a thin intermediate layer or a thin intermediate layer sequence. The auxiliary layer 14c is patterned with the aid of a resist layer 16c in a photolithographic method, a cutout 18c being produced. The cutout 18c is extended right into the semiconductor substrate 10c using the patterned resist layer 16c and optionally using the auxiliary layer 14c as a mask. Residues of the resist layer 16c that are still present, if appropriate, may subsequently be removed. An etching-back step is effected, during which the auxiliary layer 14c becomes a thinned auxiliary layer 14d, which covers a smaller area than the auxiliary layer 14c because areas 20c of the semiconductor substrate are uncovered in the upper part of an extended cutout 18d. With regard to the details, reference is made to the explanations concerning FIG. 1A.

Figure 2A:
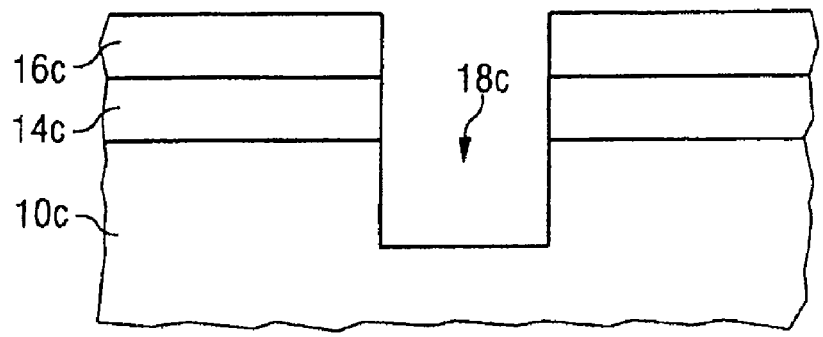
FIGS. 2A to 2D show production stages of an exemplary embodiment for producing a double-fin field effect transistor with and without underoxidation.
Figure 2B:
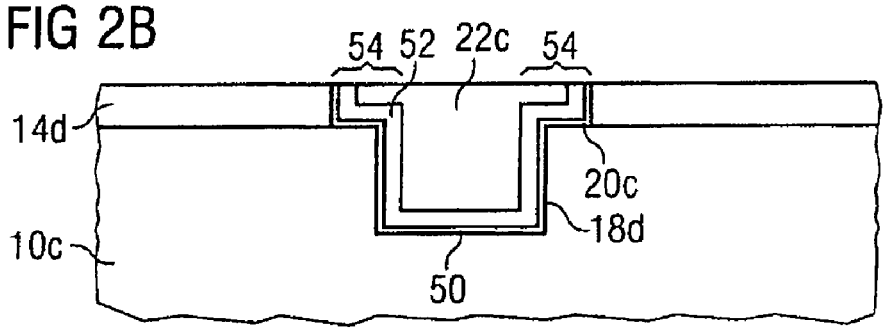

As shown in FIG. 2B, after the production of the cutout 18d, first a thin insulating layer 50 that is electrically insulating is produced, e.g. by thermal oxidation or in a deposition method. The insulating layer 50 comprises e.g. silicon dioxide or a material having a relative permittivity of greater than 3.9, the value of the relative permittivity of silicon dioxide. The electrical thickness of the insulating layer 50 is e.g. less than 25 nanometers, e.g. 5 nanometers.

Afterward, a thin gate electrode layer 52 is applied to the insulating layer 50, said gate electrode layer e.g. comprising a metal or containing a metal. As an alternative, the gate electrode layer 52 comprises a highly doped polycrystalline silicon. The thickness of the gate electrode layer 52 is e.g. less than 25 nanometers.

After the production of the gate electrode layer 52, a filling material 22c, e.g. an electrically conductive material, e.g. doped silicon, or an electrically insulating material, e.g. an oxide, is applied to the gate electrode layer 52. This is followed by planarization, stopping on the auxiliary layer 14d. By way of example, planarization is effected by a CMP method. After planarization, the insulating layer 50, the gate electrode layer 52 and the filling material 22c are still present only within the cutout 18d.

After planarization, the auxiliary layer 14d is removed selectively with respect to the semiconductor substrate 10c, with respect to the filling material 22c, with respect to the gate electrode layer 52 and as far as possible also selectively with respect to the insulating layer 50.

Figure 2C:
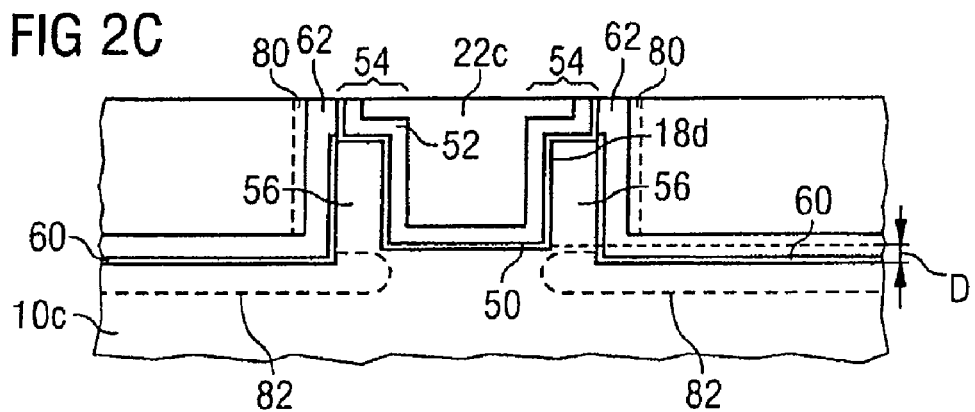

As illustrated in FIG. 2C, fins 56 are subsequently produced with the aid of projections 54 of the filling material in the cutout 18d in an anisotropic etching method. The anisotropic etching gives rise, if appropriate, to a height difference D of, for example, approximately 5 nanometers between the bottom of the cutout 18d and substrate areas lying parallel to the bottom of the cutout 18d outside the cutout 18d. The free sides of the fins 56 preferably go deeper into the semiconductor substrate 10c than the sides of the fins 56 that delimit the cutout 18c.

As is furthermore illustrated in FIG. 2C, an insulating layer 60 having the same material composition and the same layer thickness as the insulating layer 50 is produced on the uncovered side areas of the fins 56 and on the uncovered semiconductor substrate 10c. The two insulating layers 50 and 52 serve as gate dielectric of a double-fin field effect transistor in the region of the fins 56.

A further gate electrode layer 62, which comprises the same material and has the same thickness as the gate electrode layer 52, is subsequent applied to the insulating layer 60.

At this point in time, the fins 56 are already surrounded by a gate dielectric 50, 60 and by a thin gate electrode 52, 62, which, however, has not yet been patterned. The thin gate electrode 52, 62 and the filling material 22c serve as a mechanical support for the ultrathin fins 56.

Figure 2D:
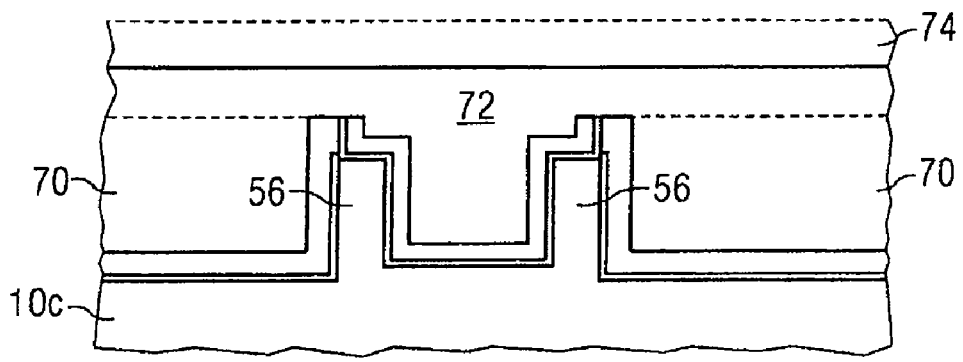

As illustrated in FIG. 2D, in the exemplary embodiment, gate material 70, e.g. doped silicon, in particular polycrystalline silicon, is applied prior to the removal of the filling material 22c made of oxide. Planarization is then effected, the filling material 22c serving as a stop. Only afterward is the filling material 22c removed and replaced by gate material 72, e.g. by polycrystalline silicon. Accordingly, the fins 56 are always adequately mechanically protected.

As illustrated in FIG. 2D, the gate material 70, 72 and the gate electrode layers 52, 62 are then patterned. By way of example, a photolithographic method and/or a spacer technique is used for this purpose. A hard mask 74 is optionally used. A step of trimming the hard mask 74 is furthermore optionally carried out in order to reduce the gate length. As an alternative, an electron beam lithography may be used.

In another exemplary embodiment, the filling material 22c is removed prior to the application of the gate material 70c using an additional lithographic method only in a central region of the fins 56. At the ends of the fins 56, by contrast, the filling material 22 remains as a support. The gate material 70 and 72 is then deposited simultaneously, so that only one planarization step is required for planarizing gate material.

The gates are subsequently patterned, e.g. using a hard mask in accordance with the first exemplary embodiment or by means of a photolithographic step for the production of minimum feature sizes.

As illustrated by dashed lines in FIG. 2C, in another exemplary embodiment, a thin oxidation protective layer 80 is deposited after the production of the gate electrode layer 62. Anisotropic etching is subsequently effected, so that the oxidation protective layer 80 remains only on the sidewalls of the fins 56 which are remote from the cutout 18d. The anisotropic etching effects etching as far as the semiconductor substrate 10c. By way of example, RIE is suitable for the anisotropic etching.

As is furthermore illustrated by dashed lines in FIG. 2C, a thermal oxidation of the semiconductor substrate 10c is then carried out, oxide regions 82 forming at the uncovered regions of the semiconductor substrate 10c and at the base of the fins 56, said oxide regions electrically insulating the fins 56 from the semiconductor substrate 10c.

The underoxidation of the fins 56 is facilitated if the distance D already amounts to several nanometers prior to the oxidation. In addition or as an alternative, during the anisotropic etching of the oxidation protective layer, too, it is possible to etch further into the semiconductor substrate 10c, for example by more than 5 nanometers. Furthermore as an alternative or in addition, the underoxidation is promoted if the semiconductor substrate 10c is isotropically etched prior to the oxidation, a cutout in each case being produced below the fin 56, but the fins 56 not being completely separated from the semiconductor substrate 10c. The mechanical support for the fins 56 is formed by the filling material 22c during the underoxidation and the isotropic undercutting of the fins that is possibly carried out, said filling material either not yet having been removed from the cutout 18d or having been removed only in a partial region of the cutout 18d.

The further method implementation corresponds to the method implementation explained with reference to FIG. 2D, that is to say application of the filling material 70 and 72 according to one of the methods explained.

Figure 3A:
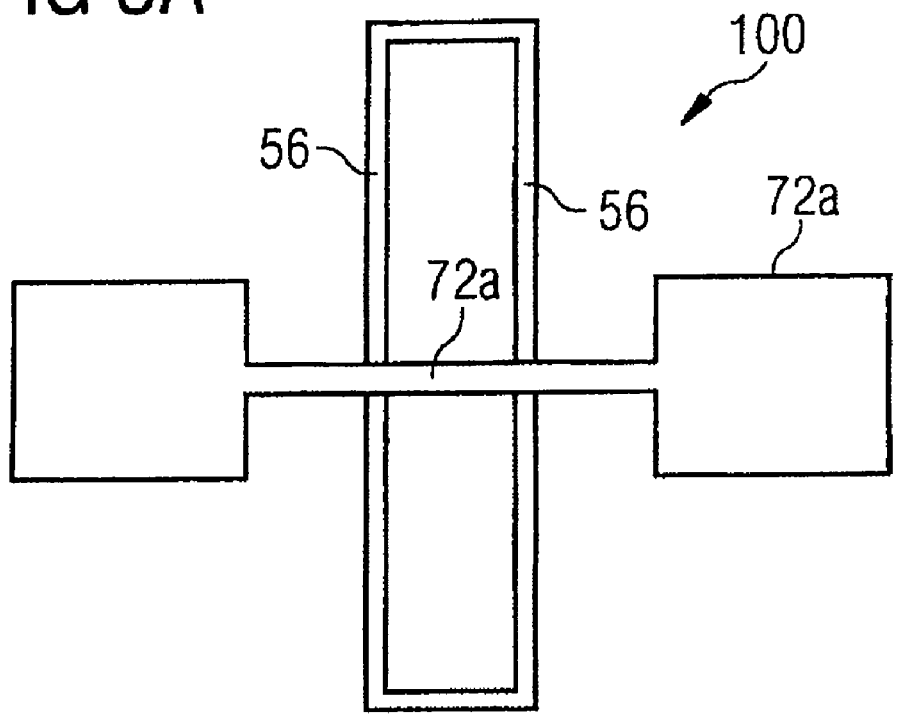
FIGS. 3A and 3B show further production stages for producing the double-fin field effect transistor.
Figure 3B:
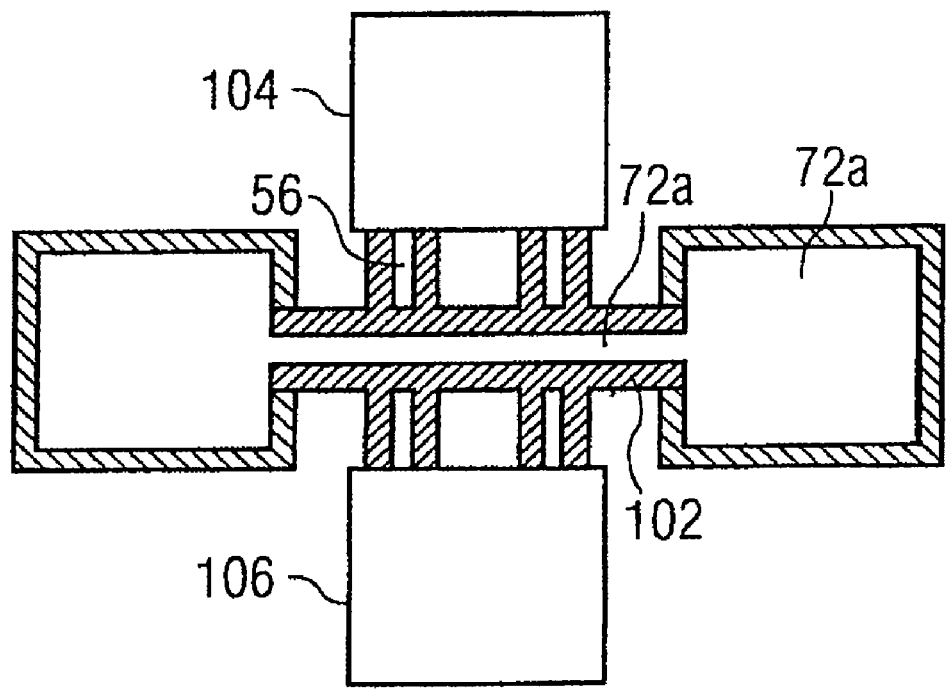

FIGS. 3A and 3B show further production stages for producing a double-fin field effect transistor 100. FIG. 3A shows the transistor 100 after the patterning of the gate stack as described above. The gate electrodes are embodied in the form of a narrow strip 72a above the fins 56. Situated at the ends of the strip are e.g. square contact areas for the connection of the gate. The gate length is given by the width of the strip and is e.g. 20 nanometers given a width of the fins 56 of in each case 6 nanometers.

As is illustrated in FIG. 3B, what is subsequently carried out involves a thermal oxidation or an oxide deposition e.g. by means of a CVD method (chemical vapor deposition) with subsequent anisotropic etching-back, oxide spacers 102 being formed at uncovered areas of the fins 56 and at uncovered sides of the gate material 72a. The oxide spacers 102 subsequently insulate the gate material from the source connection material and/or from the drain connection material, inter alia. Instead of the oxide spacers, it is also possible to use spacers made from a different material, e.g. nitride spacers, in particular silicon nitride spacers.

The next step involves effecting an optional implantation for source extensions and/or drain extensions with a comparatively low dopant concentration. The implantation is carried out e.g. obliquely toward or counter to the direction of the normal to the active surface of the semiconductor substrate 10c. After a further oxidation and an etching-back step for producing further spacers, the connection regions for the source zone and/or for the drain zone are implanted, a higher dopant concentration than before being implanted. The second implantation is also carried out e.g. obliquely or counter to the direction of the normal.

Drain and source contact holes 104 and 106 are subsequently produced. A double-fin field effect transistor 100 arises which has closely adjacent fins and a sublithographic fin width. By way of example, the following steps are carried out during the production of the source connection regions 104 or 106:

Self-aligning silicide production in accordance with the salicide technique by application of the metal for the silicide formation, selective siliciding and removal of the non-silicided metal. In this case, a silicide formation is prevented on the planar substrate basic area e.g. by the oxide produced during the underoxidation or by an additionally applied oxide layer which is applied instead of the underoxidation layer.

Planarization e.g. by application of a dielectric, e.g. an oxide, followed by e.g. CMP planarization.

Production of contact holes 104, 106 to the connection regions.

The method in accordance with FIGS. 1A to 1D enables deeper structures or structures with higher sidewalls to be etched more easily in comparison with the method in accordance with FIGS. 2A to 2D.

With the same method steps, it is also possible to produce single-fin field effect transistors if the fins are removed by means of the trimming mask in the relevant regions.

The invention claimed is:

1. A field effect transistor, comprising:
   two channel connection regions;
   a control region comprising at least two control sections;
   a fin that is formed as a projection of a mono crystalline substrate disposed between the channel connection regions and between the at least two control sections of the control region, the fin having two side areas;
   insulating regions that are electrically insulating and are disposed between the at least two control sections of the control region and the fin; and
   where the fin is isolated from the substrate at a base by an insulating material that is electrically insulating, and where the insulating material ends laterally at the fin in the mono crystalline substrate;
   where the two side areas of the fin have different heights.

2. The field effect transistor of claim 1, where the two side areas of the fin transversely adjoin two substrate areas of the substrate that are disposed in two planes spaced apart from one another by a distance greater than one nanometer.

3. The field effect transistor of claim 2, where the at least two control sections of the control region are formed on the two side areas of the fin.

4. The field effect transistor of claim 1, where the insulating material does not project beyond at least one side area of the two side areas of the fin.

5. A field effect transistor, comprising:
   two channel connection regions;
   a control region comprising at least two control sections;
   first and second fins formed as first and second projections of a mono crystalline substrate disposed between the channel connection regions and between the at least two control sections of the control region, where each fin has an inward facing side area that faces the other fin and an outward facing side area facing away from the other fin;
   insulating regions that are electrically insulating and are disposed between the at least two control sections of the control region and the first and second fins;
   where the first and second fins are isolated from the substrate at respective bases by an insulating material that is electrically insulating, and where the insulating material extends laterally from respective edges of the outward facing side areas of the fins and ends substantially at respective edges of the inward facing side areas of the fins in the mono crystalline substrate; and
   where the outward facing side areas of the fins have a greater height than the inward facing side areas of the fins.

6. The field effect transistor of claim 5, where the outward facing side areas of the fins go deeper into the substrate than the inward facing side areas of the fins.

7. The field effect transistor of claim 5, where a height difference between the outward facing side areas of the fins and the inward facing side areas of the fins is greater than one nanometer.

8. The field effect transistor of claim 5, where a height difference between the outward facing side areas of the fins and the inward facing side areas of the fins is greater than three nanometers.

9. The field effect transistor of claim 5, where a height difference between the outward facing side areas of the fins and the inward facing side areas of the fins is greater than five nanometers.

10. The field effect transistor of claim 1, where one of the two side areas of the fin goes deeper into the substrate than the other one of the two side areas of the fin.

11. The field effect transistor of claim 1, where a height difference between the two side areas of the fins is greater than one nanometer.

12. The field effect transistor of claim 1, where a height difference between the two side areas of the fins is greater than three nanometers.

13. The field effect transistor of claim 1, where a height difference between the two side areas of the fins is greater than five nanometers.

* * * * *